United States Patent
Xu et al.

(10) Patent No.: US 10,921,660 B2
(45) Date of Patent: Feb. 16, 2021

(54) CIRCUIT BOARD, DISPLAY PANEL AND DISPLAY DEVICE

(71) Applicants: BOE TECHNOLOGY GROUP CO., LTD., Beijing (CN); ORDOS YUANSHENG OPTOELECTRONICS CO., LTD., Ordos (CN)

(72) Inventors: Jingyi Xu, Beijing (CN); Kunpeng Zhang, Beijing (CN); Yanwei Ren, Beijing (CN); Yanyan Zhao, Beijing (CN); Yi Fan, Beijing (CN); Yu Liu, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 99 days.

(21) Appl. No.: 15/567,181

(22) PCT Filed: May 8, 2017

(86) PCT No.: PCT/CN2017/083474
§ 371 (c)(1),
(2) Date: Oct. 17, 2017

(87) PCT Pub. No.: WO2017/215366
PCT Pub. Date: Dec. 21, 2017

(65) Prior Publication Data
US 2018/0210297 A1 Jul. 26, 2018

(30) Foreign Application Priority Data
Jun. 17, 2016 (CN) .......................... 2016 1 0430337

(51) Int. Cl.
*G02F 1/1362* (2006.01)
*H01R 13/6594* (2011.01)
(Continued)

(52) U.S. Cl.
CPC ..... *G02F 1/136204* (2013.01); *H01R 12/613* (2013.01); *H01R 13/6594* (2013.01);
(Continued)

(58) Field of Classification Search
USPC .................................................. 361/212, 220
See application file for complete search history.

(56) References Cited

U.S. PATENT DOCUMENTS

2005/0275996 A1* 12/2005 Shin .................. G06K 9/00053
361/212
2006/0124348 A1* 6/2006 Wang .................. H05K 1/0256
174/255
(Continued)

FOREIGN PATENT DOCUMENTS

| CN | 101236315 A | 8/2008 |
| CN | 102967975 A | 3/2013 |

(Continued)

OTHER PUBLICATIONS

Office Action for Application No. PCT/CN2017/083474 dated Jul. 27, 2017, 15 pages.
(Continued)

*Primary Examiner* — Danny Nguyen
(74) *Attorney, Agent, or Firm* — Arent Fox LLP; Michael Fainberg

(57) ABSTRACT

Embodiments of the present disclosure pertain to a circuit board, a display panel and a display device. The circuit board includes a ground protection circuit, disposed in a peripheral area of the circuit board. The ground protection circuit includes one or more first wires arranged in parallel, a bridging connection part and a plurality of second wires arranged in parallel, where one end of each first wire is grounded and the other end connects to the bridging connection part electrically, while one end of each second wire
(Continued)

connects to the bridging connection part electrically and the other end is grounded. The display panel includes the circuit board and the display device includes the display panel.

8 Claims, 3 Drawing Sheets

(51) Int. Cl.
    *H01R 12/61*     (2011.01)
    *H05K 1/02*     (2006.01)
    *G06F 3/045*     (2006.01)

(52) U.S. Cl.
    CPC ......... *H05K 1/0215* (2013.01); *G02F 1/1362* (2013.01); *G06F 3/045* (2013.01); *H01R 12/61* (2013.01); *H05K 1/0259* (2013.01)

(56) References Cited

U.S. PATENT DOCUMENTS

| | | | | |
|---|---|---|---|---|
| 2009/0262094 A1* | 10/2009 | Lin | .................. | G06F 3/045 345/174 |
| 2012/0075218 A1 | 3/2012 | Lin et al. | | |
| 2015/0006511 A1* | 1/2015 | Yagoub | .................. | G06F 16/248 707/722 |
| 2016/0105951 A1* | 4/2016 | Lee | ...................... | G06F 1/1626 361/751 |

FOREIGN PATENT DOCUMENTS

| | | |
|---|---|---|
| CN | 203376735 U | 1/2014 |
| CN | 103676345 A | 3/2014 |
| CN | 104461097 A | 3/2015 |
| CN | 105320337 A | 2/2016 |
| CN | 105323944 A | 2/2016 |
| CN | 205264701 U | 5/2016 |
| CN | 106094374 A | 11/2016 |
| FR | 2758402 | 7/1998 |
| KR | 1020080020168 A | 3/2008 |

OTHER PUBLICATIONS

State Intellectual Property Office of People's Republic of China, "Notification of the First Office Action," issued in connection with Chinese Patent Application No. 201610430337.5, dated Sep. 25, 2018, 18 pages.

* cited by examiner

CIRCUIT BOARD, DISPLAY PANEL AND DISPLAY DEVICE

This application is a National Phase Entry of PCT International Application No. PCT/CN2017/083474, which was filed on May 8, 2017, and claims priority to Chinese Patent Application No. 201610430337.5, which was filed with the Chinese Patent Office on Jun. 17, 2016, both of which are incorporated by reference in their entirety, which was filed on Jun. 3, 2016, the content of which is incorporated by reference in the entirety.

FIELD

The present disclosure relates to the field of electronics, and particularly to a circuit board, a display panel and a display device.

BACKGROUND

Injury or damage caused by electrostatic discharge (ESD) to an electronic product includes a sudden injury and a latent injury. The sudden injury means that the device is seriously damaged and cannot function. This kind of injury could usually be discovered during a quality test of a manufacturing process. Whereas as the latent injury means that the device is partially damaged, and is still able to function. The latent injury is usually unable to be discovered during a test of a manufacturing process and causes instability to the product when it is being used, therefore, the latent injury might cause a greater harm to product quality. As a result, there is a demand for improving the electrostatic protection performance of electronic products.

SUMMARY

Embodiments of the disclosure provide a circuit board, a display panel and a display device, whose electrostatic protection performance has been improved.

On one aspect, some embodiments of the disclosure provide a circuit board. The circuit board includes a ground protection circuit, disposed in a peripheral area of the circuit board. The ground protection circuit includes one or more first wires arranged in parallel, a bridging connection part and a plurality of second wires arranged in parallel. One end of each first wire is grounded and the other end of each first wire is connected to the bridging connection part electrically, while one end of each second wire is connected to the bridging connection part electrically and the other end of each second wire is grounded.

According to the configuration above, since the other end of each first wire is connected to the bridging connection part electrically and one end of each second wire is connected to the bridging connection part electrically, the first wires is connected to each other electrically and the second wires is connected to each other electrically, and electrostatic discharge paths are formed consisting of first wires, of second wires, and of a first wire together with a second wire, thereby increasing the number of electrostatic discharge paths, making it easier to release static electricity through electrostatic discharge paths, and reducing the risk of electrostatic damage to the circuit board.

According to some embodiments of the disclosure, the first wires and the second wires are a continuous wire.

According to some embodiments of the disclosure, there are a plurality of the bridging connection parts, where each of the first wires is divided into a plurality of first wire segments by at least one of the bridging connection parts, and/or, each of the second wires is divided into a plurality of second wire segments by at least one of the bridging connection parts.

According to some embodiments of the disclosure, the bridging connection part is a rectangle.

According to some embodiments of the disclosure, each of the first wire is connected to one side of the rectangle electrically and each of the second wires is connected to another side of the rectangle which is opposite to the one side, electrically.

According to some embodiments of the disclosure, the bridging connection part is triangular, circular, elliptic, trapezoidal, or X-shaped. According to the configuration, the bridging connection part could be flexibly realized in various manners.

According to some embodiments of the disclosure, the bridging connection part is located at a center of a side of the circuit board. According to the configuration, since the bridging connection part is located at the center of a side of the circuit board, the number of electrostatic discharge paths could be increased by effectively taking advantage of a structure symmetrical on the side, of a product including the circuit board.

According to some embodiments of the disclosure, the circuit board includes an array substrate, and the ground protection circuit described herein could be disposed in a peripheral area of the array substrate. In this case, the bridging connection part could be disposed at a center of a shorter side of the array substrate, which, apart from being able to increase the number of electrostatic discharge paths by taking advantage of a symmetrical structure of a product, will not affect a narrow frame design at a longer side of the array substrate.

According to some embodiments of the disclosure, the circuit board could further include an additional circuit board, where a ground terminal is arranged, and each of the first wires and each of the second wires are grounded through the ground terminal, respectively. According to this configuration, the electrostatic charge paths are able to discharge to the ground through the ground terminal and thus the risk of electrostatic damage to the circuit board could be reduced.

On another aspect, some embodiments of the disclosure provide a display panel. The display panel could include a circuit board according to embodiments of the disclosure.

On still another aspect, some embodiments of the disclosure provide a display device, which includes a display panel according to embodiments of the disclosure.

According to the above-mentioned configurations, since a circuit board according to embodiments of the disclosure is adopted, the display panel and the display device are able to discharge static electricity in an easier way and reduce the risk of electrostatic damage to the circuit board.

BRIEF DESCRIPTION OF THE DRAWINGS

In order to explain the technical solutions according to embodiments of the disclosure more clearly, drawings of embodiments would be introduced briefly below. Obviously, structural schematic diagrams in the following drawings are not necessarily scaled, but are represented in a simplified form. Moreover, the drawings in the following description are merely illustrative of some embodiments of the disclosure and are not intended to limit the disclosure.

DETAILED DESCRIPTION OF THE EMBODIMENTS

To make the purpose, technical solutions and advantages of the embodiments of the present disclosure more clearly, the technical solutions according to the embodiments of the present disclosure will now be described clearly and completely in conjunction with the accompanying drawings according to the embodiments of the present disclosure, and it will be apparent that the described embodiments are merely a part, not all, of the embodiments of the present disclosure. All other embodiments obtained based on embodiments in the present disclosure, by those of ordinary skill in the art without making creative work fall within the scope of the present disclosure.

The term "connection" herein is intended to refer to a direct connection or an indirect connection between elements. In addition, it should be noted that although embodiments of the disclosure are described in a background that a circuit board includes an array substrate configured for a display panel, it will be understood by those skilled in the art that the principles of the disclosure may be applied to a circuit board of any other type which needs electrostatic protection.

Figure 1A:
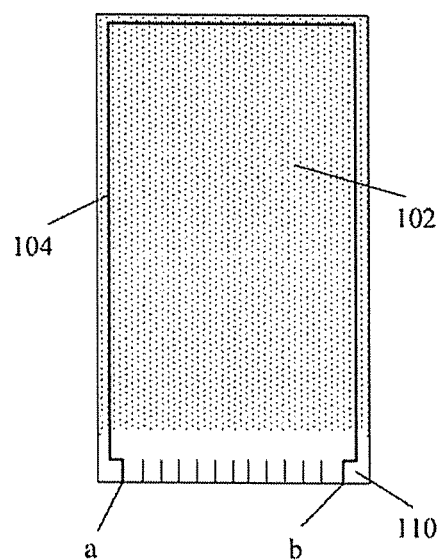
FIG. 1A is a top view of a circuit board in the related art.
Figure 1B:
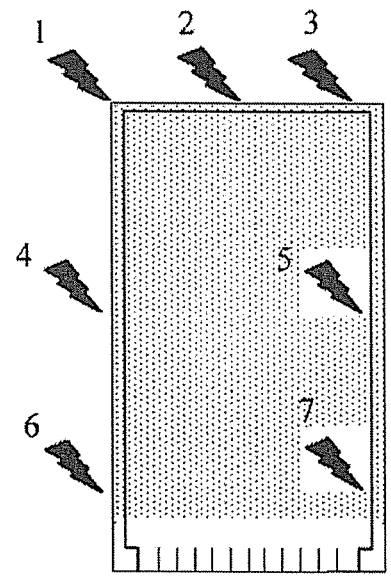
FIG. 1B is a schematic diagram of static electricity generated at a plurality of locations in the configuration of FIG. 1A.

FIG. 1A is a top view of a circuit board in the related art and FIG. 1B is a schematic diagram of static electricity generated at a plurality of locations (i.e. locations 1, 2, 3, 4, 5, 6 and 7) in the configuration of FIG. 1A. As illustrated by FIG. 1A, the circuit board could include an array substrate 102 applied to for example a liquid crystal display panel of a mobile product or an organic light emitting diode (OLED) display panel, a flexible printed circuit board (FPC) 110 and a wire 104 configured for releasing static electricity. The wire 104 is arranged along the periphery of the array substrate 102. The flexible printed circuit (FPC) 110 is attached to the array substrate 102 for providing drive to the array substrate 102. Ground terminals a and b are arranged on the FPC 110, and electrically connected to both ends of the wire 104, respectively. In this way, static electricity on the array substrate 102 is able to be released to the ground via a discharge circuit formed by the wire 104 and the ground terminals and b on the FPC 110. However, in the configuration illustrated by FIG. 1, since there is only one electrostatic discharge path, i.e. a→104→b, when static electricity is generated near the circuit board (especially at the locations illustrated by FIG. 1B), static electricity entering the ground terminals is insufficient, which might cause damage to circuits on the array substrate.

Embodiments of the disclosure provide a circuit board, a display panel and a display device, which have improved electrostatic protection performance. The circuit board, the display panel and the display device would be described below specifically according to corresponding embodiments.

I. The Circuit Board.

Figure 2A:
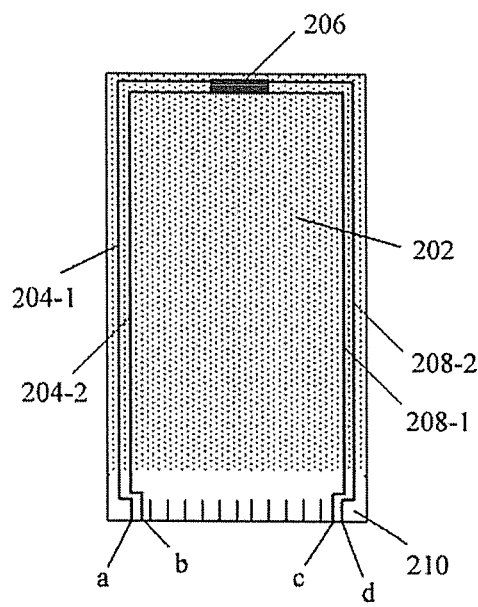
FIG. 2A is a top view of a circuit board according to an embodiment of the disclosure.
Figure 2B:
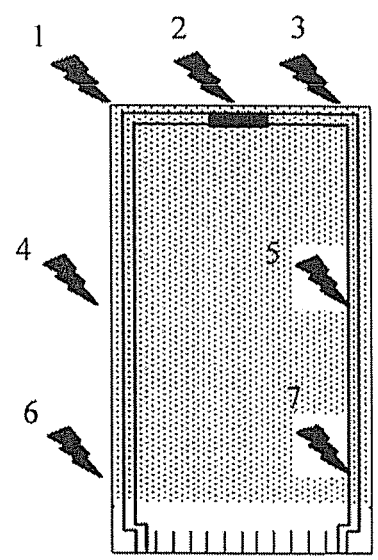
FIG. 2B is a schematic diagram of static electricity generated at a plurality of locations in the configuration of FIG. 2A.

FIG. 2A is a top view of a circuit board according to an embodiment of the disclosure, and FIG. 2B is a schematic diagram of static electricity generated at a plurality of locations (i.e. locations 1, 2, 3, 4, 5, 6 and 7) in the configuration of FIG. 2A. As illustrated by FIG. 2A, the circuit board could include an array substrate 202 configured for, for example, a liquid crystal display panel of a mobile product or an OLED display panel. In the case of a liquid crystal display panel, a non-peripheral area of the array substrate 202 could include elements such as a gate line, a data cable, a drive thin film transistor (TFT) and a holding-up capacitor. In the case of an OLED display panel, a non-peripheral area of the array substrate 202 could include elements such as a gate line, a data cable and a drive TFT.

As illustrated by FIG. 2A, the circuit board according to the embodiment includes a ground protection circuit. In an exemplary embodiment, the ground protection circuit could be disposed in a peripheral area of the array substrate 202. The ground protection circuit could include two first wires 204-1 and 204-2 in parallel, a bridging connection part 206 and two second wires 208-1 and 208-2 in parallel. One end of each of the first wires 204-1 and 204-2 is grounded, and the other end is connected to the bridging connection part 206 electrically. One end of each of the second wires 208-1 and 208-2 is connected to the bridging connection part 206 electrically and the other end is grounded. The bridging connection part 206 is located at a position corresponding to the center of a shorter side of the array substrate 202.

Figure 3:
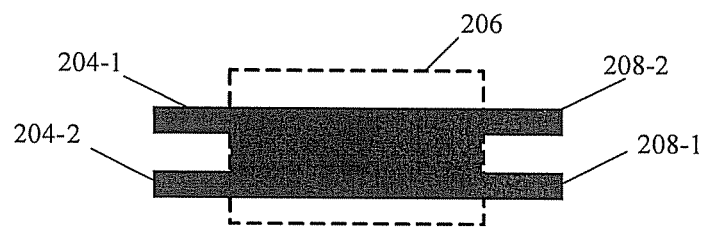
FIG. 3 is an enlarged view of an exemplary bridging connection part in FIG. 2A.

FIG. 3 is an enlarged view of the exemplary bridging connection part in FIG. 2A. As illustrated in FIG. 3, the bridging connection part 206 could be a rectangle, where a shorter side of the rectangle is electrically connected to each of the first wires 204-1 and 204-2 and the other shorter side of the rectangle opposite to the shorter side is connected to each of the second wires 208-1 and 208-2 electrically. In this way, the bridging connection part 206 electrically connects the first wire 204-1 with both second wires 208-1 and 208-2, and electrically connects the first wire 204-2 with both second wires 208-1 and 208-2.

It needs to be noted that, the first wires and the second wires are not limited to be electrically connected to both shorter sides of the rectangular bridging connection part, respectively. As an example, the first wires and the second wires could be electrically connected to both longer sides of the bridging connection part, respectively; as another example, the first wires could be connected to a shorter side of the bridging connection part and the second wires could be electrically connected to a longer side of the bridging connection part.

According to embodiments of the disclosure, the first wires, the bridging connection part and the second wires could be made of a metal material (such as silver), and the materials of which the first wires and the second wires are made could be the same or different.

The circuit board could further include an additional circuit board, where a ground terminal is disposed on the additional circuit board, and the each of the first wires and the second wires could be grounded through the ground terminal. In an example, as illustrated in FIG. 2A, the additional circuit board could be an FPC 210 attaching to the array substrate 202 for providing a drive to the array substrate 202. In the case of a liquid crystal display panel or an OLED display panel, the FPC 210 could include a peripheral drive module such as a gate driver or a source driver. As illustrated by FIG. 2A, ground terminals a, b, c and d are disposed on the FPC 210, and electrically connected to the wires 204-1, 204-2, 208-1 and 208-2, respectively. In this way, static electricity applied to the array substrate 202 externally could be released to the ground through a discharge circuit formed by the first wires, the bridging connection part, the second wires and the ground terminals a, b, c, d.

Since the bridging connection part 206 connects each first wire with both the second wires electrically, the first wires are electrically connected to each other and the second wires are electrically connected to each other, electrostatic discharge paths, consisting of both the first wires, of both the second wires, as well as of a first wire and a second wire, are formed, thereby forming a large number of effective shielding ground wires to protect the array substrate from ESD damage.

According to embodiments of the disclosure, the bridging connection part 206 is disposed at a position corresponding to the center of a shorter side of the array substrate 202, which is able to increase the number of ESD path by effectively taking advantage of the structure symmetrical on the shorter side.

As an example, when a reliable ESD test is performed (the lightning shaped icons in FIG. 1B and FIG. 2B represent positions where static electricity is generated during a reliable ESD test), if static electricity is generated at position 2 of the FIG. 2B, then discharge paths of the circuit board includes the following 6 discharge paths: a→204-1→206→208-1→c, b→204-2→206→208-1→c, a→204-1→206→208-2→d, b→204-2→206→208-2→d, a→204-1→206→204-2→b, c→208-1→206→208-2→d. However, if static electricity is generated at position 2 of the FIG. 1B, then there is only one discharge path of the circuit board, i.e. a→104→b. Therefore, the number of discharge paths of the circuit board illustrated by FIG. 2A and FIG. 2B according to embodiments are six times as many as the number of discharge paths of the circuit board illustrated by FIG. 1A and FIG. 1B. Obviously, embodiments of the disclosure are able to increase the number of discharge paths with different ground wires, thereby alleviating the problem of breakdown of a driving circuit on the circuit board by ESD due to a small number of discharge paths and improving the ability to protect against ESD. Similarly, static electricity generated at other locations in FIG. 2B could also be released through the above-mentioned six paths.

The ground protection circuit of the circuit board according to embodiments could be made by using any technique for forming a metal layer in the related art. For example, the first wires, the bridging connection part and the second wires could be formed by photolithography as to form the ground protection circuit; or the ground protection circuit could be formed in the peripheral area of the circuit board by deposition or sputtering.

It can be seen from above that, embodiments of the disclosure could prevent from ESD injury by optimizing the pattern of the ground protection circuit, thereby alleviating the negative (NG) problem of an ESD test for product reliability. In addition, embodiments of the disclosure does not need to add any additional masks, does not need to change the thickness of a film layer, does not need to increasing the number of manufacturing steps, therefore, the production capacity will not be reduced and ESD could be prevented against.

It should be understood that the disclosure is not limited to the above-mentioned embodiments. Firstly, the number of first wires and the number of second wires are not limited to two, respectively. As an example, as illustrated by FIG. 4A, there could be one first wire and two second wires, or there could be one second wire and two first wires. As another example, there could be a plurality of first wires and a plurality of second wires. Secondly, the bridging connection part is not limited to be located corresponding to the center of a shorter side of the array substrate. As an example, the bridging connection part could be located at any position along the periphery of the array substrate, for example, the bridging connection part could be located at the center of a longer side of the array substrate.

Figure 4:
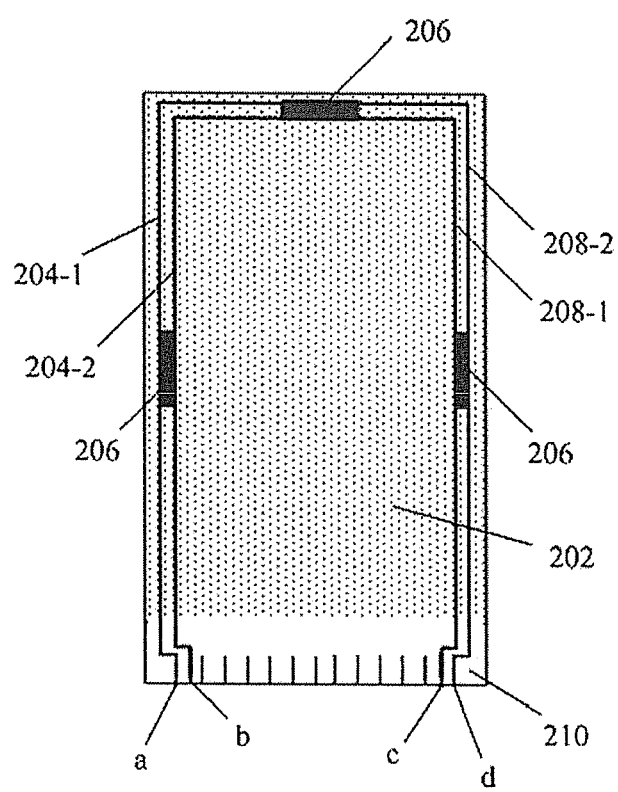
FIG. 4 is a top view of a circuit board according to another embodiment of the disclosure.

It should also be understood that, according to embodiments of the disclosure, the number of the bridging connection part is not limited to one. FIG. 4 is a top view of a circuit board according to another embodiment of the disclosure. In the embodiment illustrated by FIG. 4, there are three bridging connection parts, and each of the first wires 204-1 and 204-2 could be divided into two first wire segments by one of the three bridging connection parts 206, i.e., each of the first wires 204-1 and 204-2 could include two first wire segments, and the two first wire segments are electrically connected by a bridging connection part 206. Similarly, each of the second wires 208-1 and 208-2 could be divided into two second wire segments by another bridging connection part 206, i.e., each of the second wires 208-1 and 208-2 could include two second wire segments, which are electrically connected by the bridging connection part 206. It can be understood that, according to the embodiment illustrated by FIG. 4, the number of bridging connection parts could be more than three, and correspondingly, the bridging connection parts could also divide the first wires and the second wires into more wire segments. In the embodiment, two or more bridging connection parts and wires between them as a whole could be considered as a relatively large bridging connection part.

Figure 5A:
FIG. 5A-5I are schematic diagrams of a bridging connection part according to optional embodiments of the present disclosure.
Figure 5B:
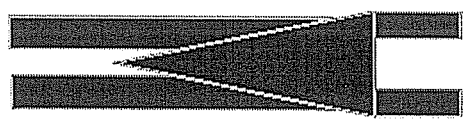
Figure 5C:
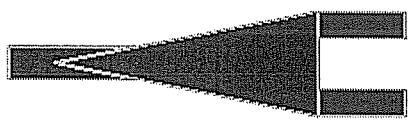
Figure 5D:
Figure 5E:
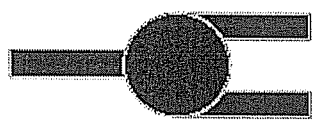
Figure 5F:
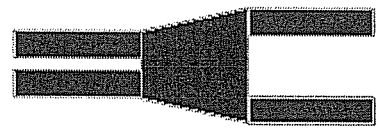
Figure 5G:
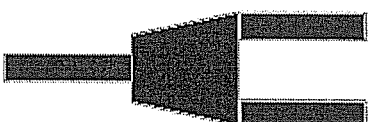
Figure 5H:
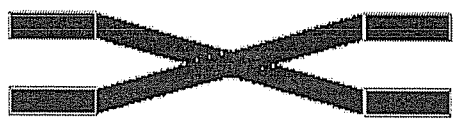
Figure 5I:

Moreover, the shape of a bridging connection part 206 is not limited to rectangle as illustrated by FIG. 3 and FIG. 5A. As an example, the bridging connection part could be triangular (refer to FIG. 5B and FIG. 5C), circular (refer to FIG. 5D and FIG. 5E), elliptic (similar to that of FIG. 5D and FIG. 5E), trapezoidal (refer to FIG. 5F and FIG. 5G) or X-shaped (refer to FIG. 5H and FIG. 5I). The bridging connection part could also have any other suitable shape, as long as it can be electrically connected to each of the first wires and each of the second wires. It should be noted that the bridging connection parts shown by FIG. 3 and FIG. 5A-5I are just exemplary.

It should be noted that according to embodiments of the disclosure, if layout space for the ground protection circuit allows, the width of each wire could be widened as much as possible to reduce the resistance of each wire, so as to discharge static electricity more efficiently.

According to embodiments of the disclosure, a ground terminal is not limited to be disposed on an FPC. As an example, a ground terminal could be disposed on an inflexible circuit board connected with the array substrate. As another example, a ground terminal could also be disposed on the array substrate.

According to embodiments of the disclosure, since the ground protection circuit according to embodiments of the disclosure is disposed in a peripheral area of the circuit board, the type or function of a circuit disposed in a non-peripheral area according to embodiments of the disclosure is not limited, i.e., the ground protection circuit according to embodiments of the disclosure is able to be applied to a circuit board of any other kind that needs electrostatic protection. In other words, at least one embodiment of the disclosure provides a circuit board, including a ground protection circuit arranged in a peripheral area of the circuit board, where the ground protection circuit includes one or more first wires arranged in parallel, a bridging connection part, and a plurality of second wires arranged in parallel; one end of each first wire is grounded, and the other end connects to the bridging connection part electrically; one end of each second wire connects to the bridging connection part electrically and the other end is grounded.

II. The Display Panel and the Display Device.

The display panel according to embodiments of the disclosure could include a circuit board according to above-mentioned embodiments of the disclosure, and could be, for example, a liquid crystal display panel or an OLED display panel. Moreover, the display device according to embodiments of the disclosure could include a display panel according to embodiments of the disclosure and could be a liquid crystal display device or an OLED display device.

With the circuit board according to above-mentioned embodiments of the disclosure included, the display panel and the display device according to embodiments of the disclosure have improved electrostatic protection performance.

It should be noted that only exemplary embodiments of the disclosure are described above, which are not intended to limit the protection scope of the disclosure. The protection scope of the disclosure is determined by the accompanying claims.

The invention claimed is:

1. A circuit board, comprising a ground protection circuit, disposed in a peripheral area of the circuit board, wherein
the ground protection circuit comprises one or more first wires arranged in parallel, a bridging connection part and a plurality of second wires arranged in parallel;
one end of each first wire is grounded and the other end of each first wire is connected to the bridging connection part electrically, and
one end of each second wire is connected to the bridging connection part electrically and the other end of each second wire is grounded;
wherein the bridging connection part is a rectangle, and each of the first wires is electrically connected to one side of the rectangle and each of the second wires is electrically connected to another side of the rectangle which is opposite to the one side.

2. The circuit board according to claim 1, wherein each of the first wires and each of the second wires are continuous wires.

3. The circuit board according to claim 1, wherein there are a plurality of the bridging connection parts, each of the first wires is divided into a plurality of first wire segments by at least one of the bridging connection parts, and/or, each of the second wires is divided into a plurality of second wire segments by at least one of the bridging connection parts.

4. The circuit board according to claim 1, wherein the bridging connection part is located at a center of a side of the circuit board.

5. The circuit board according to claim 1, wherein the circuit board further comprises an array substrate, and the ground protection circuit is disposed in a peripheral area of the array substrate.

6. The circuit board according to claim 5, wherein the circuit board further comprises an additional circuit board, a ground terminal is arranged on the additional circuit board, and each of the first wires and each of the second wires are grounded through the ground terminal, respectively.

7. A display panel, comprising a circuit board according to claim 1.

8. A display device, comprising the display panel according to claim 7.

* * * * *